(12) United States Patent
Bomer

(10) Patent No.: US 11,653,460 B2
(45) Date of Patent: *May 16, 2023

(54) HINGE

(71) Applicant: EAST WEST MANUFACTURING, LLC, Atlanta, GA (US)

(72) Inventor: Benjamin W. Bomer, Swannanoa, NC (US)

(73) Assignee: East West Manufacturing, LLC, Atlanta, GA (US)

( * ) Notice: Subject to any disclaimer, the term of this patent is extended or adjusted under 35 U.S.C. 154(b) by 436 days.

This patent is subject to a terminal disclaimer.

(21) Appl. No.: 16/856,772

(22) Filed: Apr. 23, 2020

(65) Prior Publication Data

US 2020/0253070 A1 Aug. 6, 2020

Related U.S. Application Data

(63) Continuation-in-part of application No. 16/135,340, filed on Sep. 19, 2018, now Pat. No. 10,669,762.

(60) Provisional application No. 62/560,772, filed on Sep. 20, 2017.

(51) Int. Cl.
| | |
|---|---|
| E05D 3/02 | (2006.01) |
| H05K 5/02 | (2006.01) |
| E05D 11/00 | (2006.01) |
| E05D 5/14 | (2006.01) |
| H05K 5/00 | (2006.01) |
| E05D 5/10 | (2006.01) |

(52) U.S. Cl.
CPC ............. *H05K 5/0226* (2013.01); *E05D 3/02* (2013.01); *E05D 5/10* (2013.01); *E05D 5/14* (2013.01); *E05D 11/0081* (2013.01); *H05K 5/0004* (2013.01); *H05K 5/0247* (2013.01); *E05D 2005/102* (2013.01); *E05Y 2900/606* (2013.01)

(58) Field of Classification Search
CPC .... E05D 1/02; E05D 3/02; E05D 5/10; E05D 5/14; E05D 5/023; E05D 11/0081; E05D 15/522; E05D 2005/102; E05Y 2900/606; H05K 5/0004; H05K 5/0226; H05K 5/0247
USPC .................................. 16/255, 386, 387, 388
See application file for complete search history.

(56) References Cited

U.S. PATENT DOCUMENTS

| | | | |
|---|---|---|---|
| 4,412,711 A | 11/1983 | Suska | |
| 5,390,075 A * | 2/1995 | English | ................. G06F 1/1681 174/136 |
| 5,727,960 A | 3/1998 | Zehrung | |

(Continued)

FOREIGN PATENT DOCUMENTS

| | | |
|---|---|---|
| JP | 2003028137 A | 1/2003 |
| WO | 2004021685 A1 | 3/2004 |

OTHER PUBLICATIONS

International Search Report dated Jan. 7, 2019 in corresponding international application No. PCT/IB2018/057219 filed Sep. 19, 2018.

*Primary Examiner* — Roberta S Delisle
(74) *Attorney, Agent, or Firm* — Smith Gambrell & Russell LLP

(57) ABSTRACT

A hinge assembly for pivotally joining the opposing halves of a carryable case, especially a case for housing an electronic apparatus. The disclosed hinge is adapted to convey electrical conductors from one half of the case to the other, while protecting them from damage by excessive flexing, abrasion, moisture, and debris.

20 Claims, 10 Drawing Sheets

(56) References Cited

U.S. PATENT DOCUMENTS

| | | | |
|---|---|---|---|
| 6,865,778 B2* | 3/2005 | Pan | H04M 1/0216 |
| | | | 16/386 |
| 7,380,313 B2 | 6/2008 | Akiyama et al. | |
| 7,469,451 B2* | 12/2008 | Hashizume | G06F 1/1616 |
| | | | 16/225 |
| 7,824,200 B2 | 11/2010 | Bryla et al. | |
| 8,769,771 B2* | 7/2014 | Hsu | G06F 1/1683 |
| | | | 16/386 |
| 9,483,083 B1 | 11/2016 | Zaloom | |
| 9,624,706 B2 | 4/2017 | Jacobs | |
| 2005/0132536 A1 | 6/2005 | Hashizume | |
| 2006/0017361 A1 | 1/2006 | Rendel et al. | |
| 2007/0032275 A1 | 2/2007 | Suzuki et al. | |
| 2009/0237871 A1 | 9/2009 | Shi et al. | |
| 2012/0272477 A1* | 11/2012 | Mirick | E05D 11/00 |
| | | | 16/386 |
| 2013/0182403 A1 | 7/2013 | Yang | |
| 2015/0337579 A1* | 11/2015 | Jacobs | G06F 1/1616 |
| | | | 361/679.55 |
| 2016/0161994 A1* | 6/2016 | Lee | F16C 11/04 |
| | | | 16/385 |

* cited by examiner

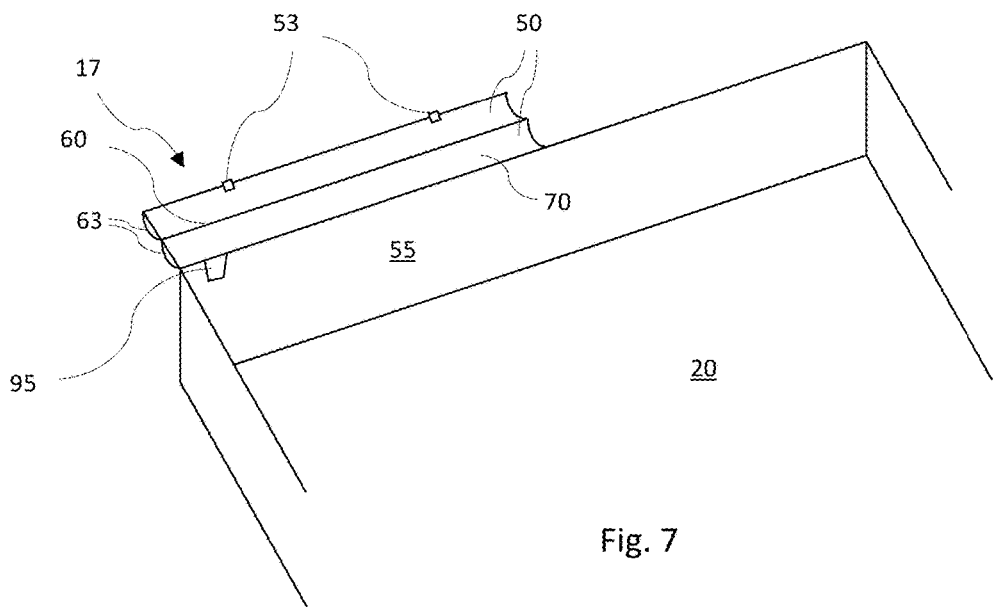
Fig. 7
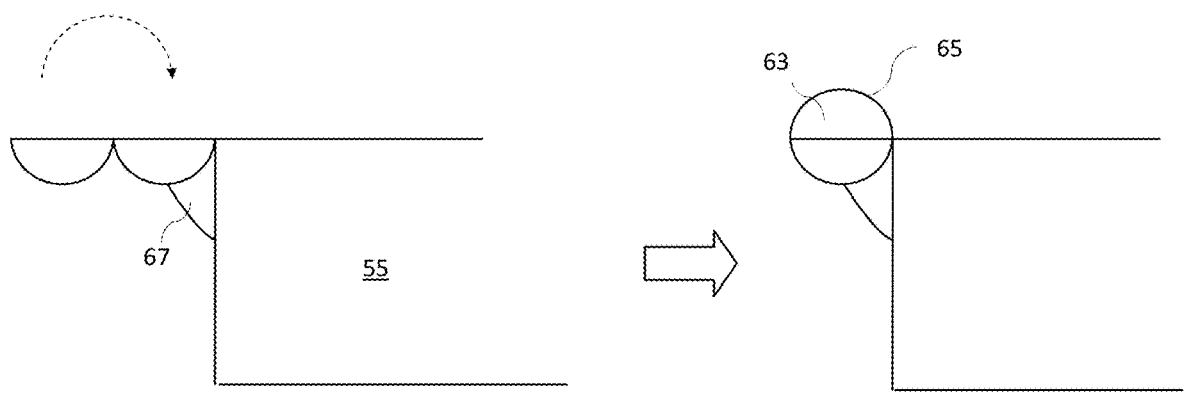
Fig. 8A
Fig. 8B

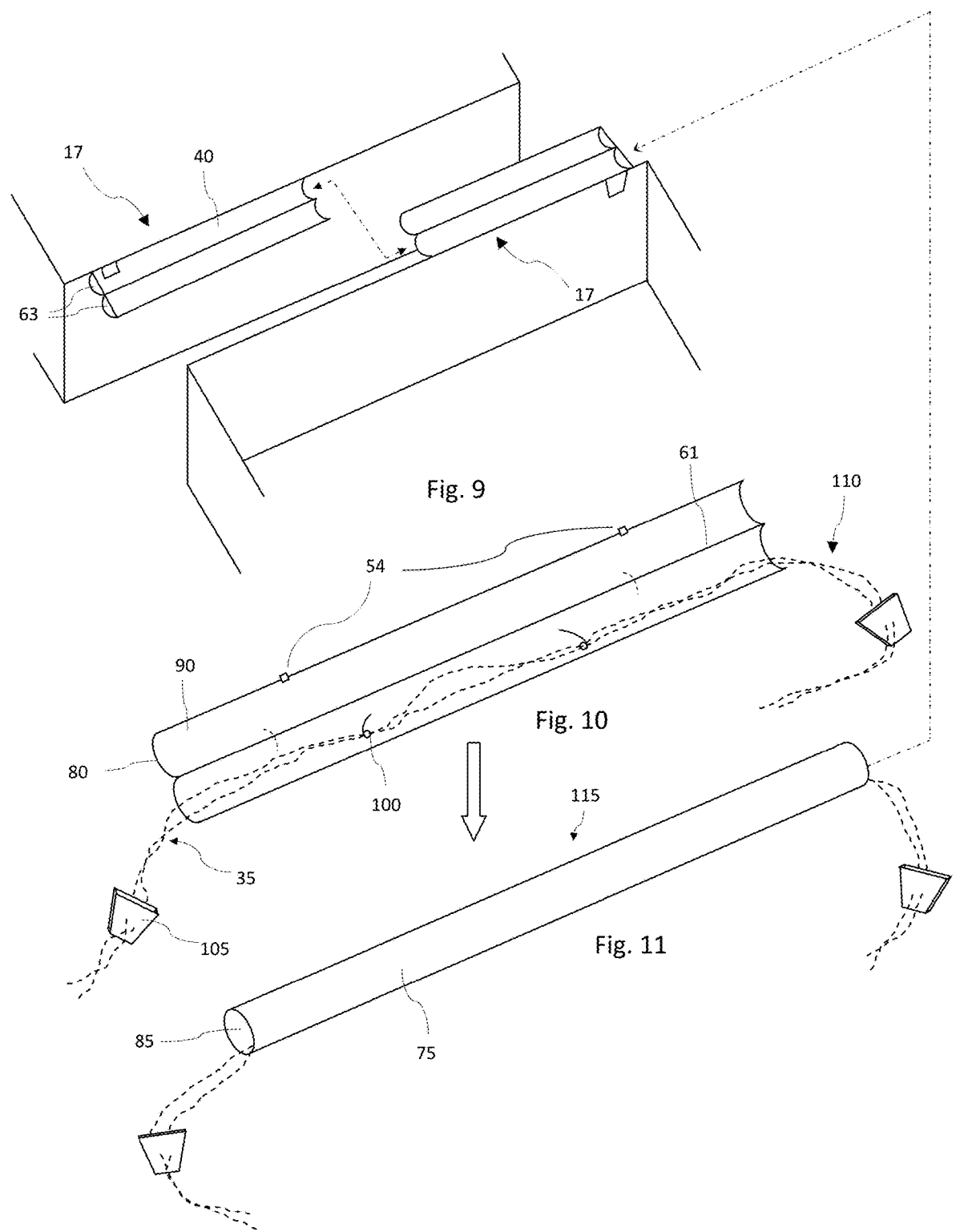

HINGE

CROSS-REFERENCE TO RELATED APPLICATION

The present application is a continuation-in-part (CIP) of U.S. patent application Ser. No. 16/135,340, filed on Sep. 19, 2018, which claims priority to U.S. Provisional Patent Application No. 62/560,772, entitled: Hinge, filed on Sep. 20, 2017, the content of each of which is incorporated herein by reference.

TECHNOLOGICAL FIELD

The present subject matter is directed generally to a hinge assembly, and more precisely to a hinge assembly for pivotally coupling opposing portions of a carryable case, especially a case for housing electronics, and adapted as a conduit for electrical conductors.

BACKGROUND

Various forms of electronics-oriented equipment are often housed in a carryable hard-sided case similar to a suitcase, briefcase, or the like, affording convenient portability, security, and other benefits. Frequently, electrical connections comprising wires or cables are permanently extended from one of the opposing portions of the case to the other in order to link electronic components. In such instances, the cables need protection from snarling, stretching, unnecessary flexing and bending, and other mechanical forces that might otherwise damage the wires, especially as a result of repeated opening and closure of the case.

The hinge mechanism coupling the halves of a case would appear to be an expedient means of conveying such interconnecting electrical conductors. Additionally, such a hinge should be sturdy and reliable, as well as easily and inexpensively fabricated and assembled.

Accordingly, it would be desirable for a case enclosing electronic components to have a durable hinge pivotally joining the opposing halves of the case, and adapted to function as a conduit to carry electric cables from one case member to the other, such that the cables are protected from mechanical forces, as well as moisture and debris which might damage the wires. Additionally, the hinge would have a minimum of simple, easily fabricated components, and be readily assembled.

The foregoing background discussion is intended solely to aid the reader and not to limit the innovations described herein. Thus, the foregoing discussion should not be taken to indicate that any particular element of a prior system is unsuitable for use with the innovations described herein, nor is it intended to indicate that any element is essential in implementing the innovations described herein. The implementations and application of the innovations described herein are defined by the appended claims.

BRIEF SUMMARY

The present disclosure provides a hinge assembly for rotatably coupling opposing halves of a housing of a carrying case containing electronic components. In one implementation, the hinge assembly may comprise at least two hinge segments, each comprising a first hollow semi-cylinder joined to a second hollow semi-cylinder by a living hinge, the opposing semi-cylinders forming a hollow cylinder when brought together, the at least two hinge segments configured to rotate about a common axis and creating a continuous central channel therethrough when aligned in linear fashion, and a hollow, tubular connecting rod. The central channel of the at least two hinge segments may be configured to receive the hollow, tubular connecting rod therein, and the at least two hinge segments may be configured to be secured together. In some implementations, each of the at least two hinge segments may further include an opening in a side wall thereof configured to permit passage of one or more electrical conductors into a channel thereof. In some implementations, the one or more electrical conductors may be configured to exit the hinge assembly proximate terminal ends thereof. In some implementations, the at least two hinge segments may be configured to rotate relative to the connecting rod. In some implementations, the connecting rod may be formed from a first hollow semi-cylinder joined to a second hollow semi-cylinder by a living hinge, the opposing semi-cylinders defining a continuous central passage when brought together, and the central passage may be configured to receive one or more electrical conductors therethrough. In some implementations, the connecting rod may include openings in a side wall thereof configured to permit the passage of the electrical conductors into the central passage thereof. In some implementations, one or more of the opposing semi-cylinders of the at least two hinge segments may include fasteners configured to secure the opposing semi-cylinders together. In some implementations, respective ends of the at least two hinge segments may be closed off.

The present disclosure also provides a carrying case containing electronic components. In one implementation, the carrying case may comprise opposing halves of a housing, and a hinge assembly for rotatably coupling the opposing halves of the housing, the hinge assembly comprising at least two hinge segments, each comprising a first hollow semi-cylinder joined to a second hollow semi-cylinder by a living hinge, the opposing semi-cylinders forming a hollow cylinder when brought together, the at least two hinge segments configured to rotate about a common axis and creating a continuous central channel therethrough when aligned in linear fashion, and a hollow, tubular connecting rod. The central channel of the at least two hinge segments may be configured to receive the hollow, tubular connecting rod therein, and the at least two hinge segments may be configured to be secured together. In some implementations, each of the at least two hinge segments of the hinge assembly may further include an opening in a side wall thereof configured to permit passage of one or more electrical conductors into a channel thereof. In some implementations, the at least two hinge segments of the hinge assembly may be configured to rotate relative to the connecting rod. In some implementations, the one or more electrical conductors may be configured to exit the hinge assembly proximate terminal ends thereof. In some implementations, the at least two hinge segments of the hinge assembly may be integrally joined to the housing of the carrying case by plastic injection molding, and the at least two hinge segments may form a unitary component with the housing. In some implementations, the at least two hinge segments of the hinge assembly may define a side wall, and the side wall may include a support buttress integrally joined to the hinge segments and the housing of the carrying case. In some implementations, the connecting rod of the hinge assembly may be formed from a first hollow semi-cylinder joined to a second hollow semi-cylinder by a living hinge, the opposing semi-cylinders defining a continuous central passage when brought together, and the central passage may be configured to receive one or more electrical conductors therethrough. In some implementations, the connecting rod of the hinge assembly may include openings in a side wall thereof configured to permit the passage of the electrical conductors into the central passage thereof. In some implementations, one or more of the opposing semi-cylinders of the at least two hinge segments of the hinge assembly may include fasteners configured to secure the opposing semi-cylinders together. In some implementations, the housing may further include corner protectors located proximate opposite ends of the hinge assembly and configured to protect the hinge assembly. In some implementations, a length of the hinge assembly may be shorter than a length of the housing.

The present disclosure also provides a method of assembling a hinge assembly for use with a carrying case that includes opposing halves of a housing that defines a housing interior and contains electronic components. In one implementation, the method may comprise providing a hinge assembly that includes at least two hinge segments, each comprising a first hollow semi-cylinder joined to a second hollow semi-cylinder by a living hinge, providing a wire harness that includes a plurality of electrical conductors bound by at least one cable fastening tie, providing a hollow, tubular connecting rod, installing the wire harness into connecting rod to create a connecting rod sub-assembly, installing the connecting rod sub-assembly into the hinge segments, and fastening the hinge segments together such that ends of the plurality of electrical connectors extend through the hinge assembly and the housing and into the housing interior.

The present disclosure also provides a hinge assembly for rotatably coupling opposing halves of a housing of a carrying case containing electronic components, the hinge assembly comprising at least two cable hinge segments, each comprising a first hollow section and a second hollow section, the at least two cable hinge segments configured to rotate about a common axis and creating a continuous central channel therethrough when aligned in linear fashion, and a hollow, tubular connecting rod. The central channel of the at least two hinge segments may be configured to receive the hollow, tubular connecting rod therein. In some implementations, each of the at least two cable hinge segments may further include an opening in a side wall thereof configured to permit passage of one or more electrical conductors into a channel thereof. In some implementations, the one or more electrical conductors may be configured to exit the hinge assembly proximate terminal ends thereof. In some implementations, the at least two cable hinge segments may be configured to rotate relative to the connecting rod. In some implementations, the connecting rod may be formed from a first hollow semi-cylinder joined to a second hollow semi-cylinder by a living hinge, the opposing semi-cylinders defining a continuous central passage when brought together, and the central passage may be configured to receive one or more electrical conductors therethrough. In some implementations, the connecting rod may include openings in a side wall thereof configured to permit the passage of the electrical conductors into the central passage thereof. In some implementations, one or more of the opposing sections of the at least two cable hinge segments may include fasteners configured to secure the opposing sections together. In some implementations, respective ends of the at least two cable hinge segments may be closed off.

The present disclosure also provides a hinge assembly of a carrying case containing electronic components, the hinge assembly comprising at least two pin hinge assemblies, and at least two cable hinge assemblies. Each of the at least two cable hinge assemblies may comprise a pass-through portion and a cover portion, one of the at least two pass-through portions may be configured to convey one or more electrical conductors to another of the at least two pass-through portions, and one of the at least two cover portions may be configured to cover one of the at least two pass-through portions, and another of the at least two cover portions may be configured to cover another of the at least two pass-through portions. In some implementations, the at least two pin hinge assemblies may comprise a first pin hinge assembly and a second pin hinge assembly, and the at least two cable hinge assemblies may comprise a first cable hinge assembly and a second cable hinge assembly, and the first and second cable hinge assemblies may be located between the first and second pin hinge assemblies. In some implementations, the first cable hinge assembly may be located proximate the second cable hinge assembly. In some implementations, each of the at least two cable hinge assemblies may include an opening configured to permit passage of one or more electrical conductors therethrough.

The present disclosure also provides a carrying case containing electronic components, the carrying case comprising opposing halves of a housing, and a hinge assembly comprising at least two pin hinge assemblies, and at least two cable hinge assemblies. Each of the at least two cable hinge assemblies may comprise a pass-through portion and a cover portion, one of the at least two pass-through portions may be configured to convey one or more electrical conductors to another of the at least two pass-through portions, and one of the at least two cover portions may be configured to cover one of the at least two pass-through portions, and another of the at least two cover portions may be configured to cover another of the at least two pass-through portions. In some implementations, the at least two pin hinge assemblies may comprise a first pin hinge assembly and a second pin hinge assembly, and the at least two cable hinge assemblies may comprise a first cable hinge assembly and a second cable hinge assembly, and the first and second cable hinge assemblies may be located between the first and second pin hinge assemblies. In some implementations, the first cable hinge assembly may be located proximate the second cable hinge assembly. In some implementations, each of the at least two cable hinge assemblies may include an opening configured to permit passage of the one or more electrical conductors therethrough. In some implementations, one of the at least two cable hinge assemblies may be configured to rotate relative to another of the at least two cable hinge assemblies. In some implementations, the pass-through portion of one of the at least two cable hinge assemblies may be integrally joined to one half of the housing, and the pass-through portion of another of the at least two cable hinge assemblies may be integrally joined to the other half of the housing. In some implementations, each of the at least two cable hinge assemblies may include one or more fasteners configured to secure a respective cover portion to the pass-through portion. In some implementations, each of the at least two pin assemblies may include a bracket portion and a pin, and wherein part of the bracket portion is integrally joined to one half of the housing, and another part of the bracket is integrally joined to another half of the housing.

These and other features, aspects, and advantages of the disclosure will be apparent from a reading of the following detailed description together with the accompanying drawings, which are briefly described below.

BRIEF DESCRIPTION OF THE DRAWINGS

The present disclosure is illustrated by way of example and not limitation in the figures of the accompanying drawings, in which like references indicate similar elements and wherein:

FIG. 7 is an elevated perspective side view of a hinge segment in the open configuration in relation to an illustrative carrying case;

FIG. 8A is a side view of a hinge segment in the open configuration in relation to an illustrative carrying case;

FIG. 8B is a side view of a hinge segment in the closed configuration in relation to an illustrative carrying case;

FIG. 9 is an elevated perspective side view of hinge segments in the open configuration attached to opposing members of an illustrative carrying case;

FIG. 10 is an elevated perspective side view of a hinge connecting rod in the open configuration including an illustrative electrical harness assembly;

FIG. 11 is an elevated perspective side view of a hinge connecting rod assembly;

DETAILED DESCRIPTION

So that the implementations presented herein may be readily understood, certain terms are first defined. It should be noted that, as used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

In the following detailed description, references are made to the accompanying drawings, which form a part of the description and in which are shown, by way of illustration, specific implementations in accordance with the described implementations. Although these implementations are described in sufficient detail to enable one skilled in the art to practice the described implementations, it is understood that these examples are not limiting, such that other implementations may be used and changes may be made without departing from the spirit and scope of the described implementations.

Figure 1:
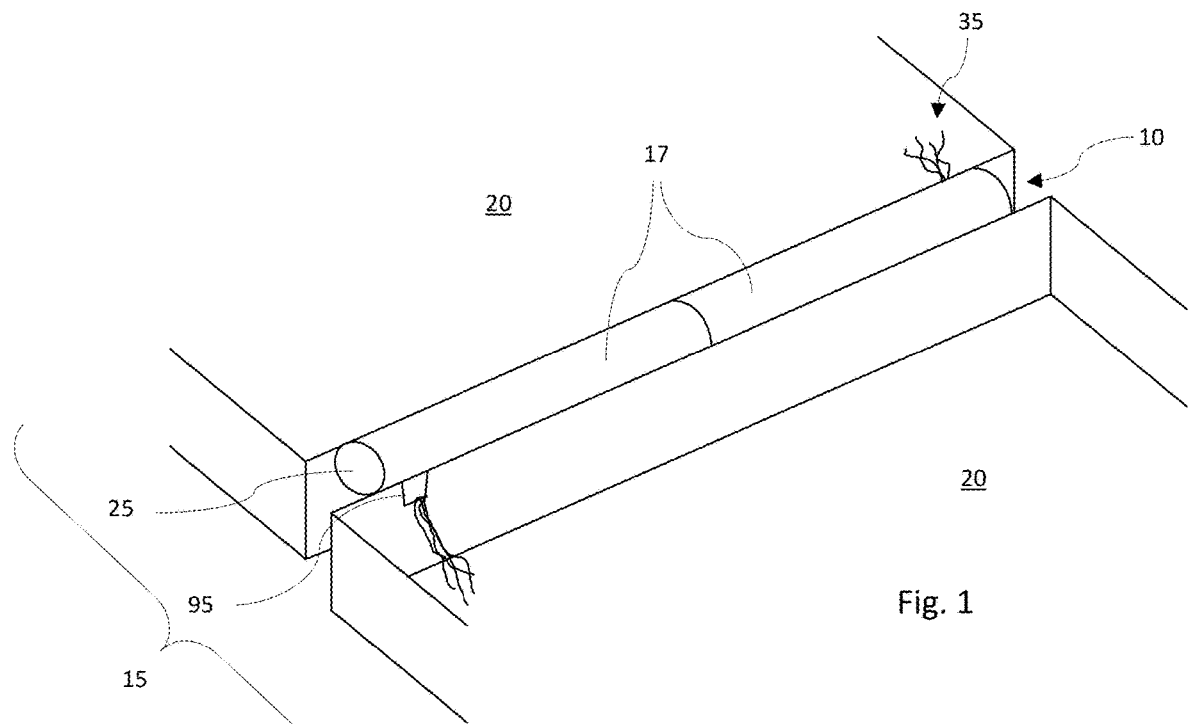
FIG. 1 is an elevated perspective side view of an example implementation of a hinge shown in relation to an illustrative carrying case.
Figure 2:
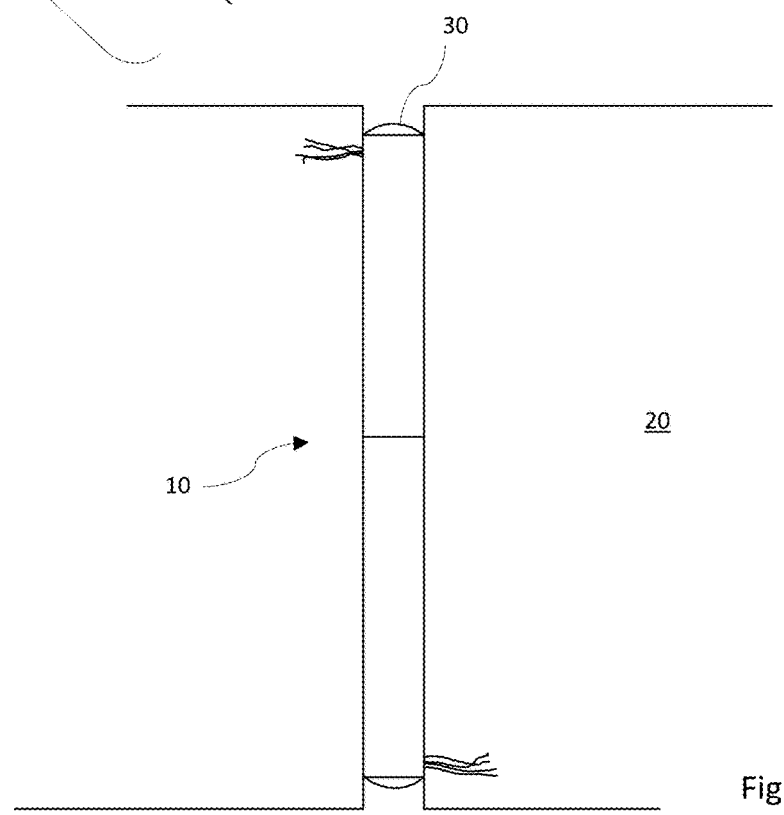
FIG. 2 is a side view of an example implementation of a hinge assembly shown in relation to an illustrative carrying case.

Referring to the drawings wherein the present disclosure is directed to a hinge assembly adapted for pivotaby joining the opposing halves of a case, specifically for a carryable case housing electronic apparatus. In FIGS. 1-6 is shown a hinge assembly 10, according to an implementation, depicting its external features in relation to an illustrative case 15. According to the present inventive concept, in FIGS. 1-2 is shown, an example implementation of a hinge assembly 10 connecting the two opposing members of an illustrative case 15 with the opposing case members in an open configuration. In general aspect, the hinge assembly 10 takes the form of an elongated cylinder comprising, in this particular construction, two (2) hinge segments 17 which are attached to opposite halves of the case 15 and rotate about a common axis. In this implementation, the terminal ends 25 of the hinge assembly 10 are closed with suitable caps 30. In some implementations, the caps 30 may provide a seal against moisture and debris from entering the hinge assembly interior, and also protect the terminal ends 25 of the hinge from impact damage.

For illustrative purposes, several representative electric cables 35 are depicted exiting the hinge assembly side wall into the case housing interior 20. In this particular example, the cables 35 exit the hinge assembly side wall near the terminal ends 25. In other possible implementations, the cables may exit the side wall at other locations.

Figure 3:
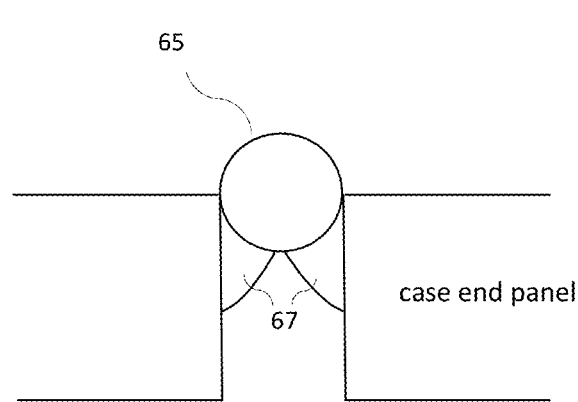
FIG. 3 is an end view of an example implementation of a hinge assembly shown in relation to an illustrative carrying case in open configuration.
Figure 4:
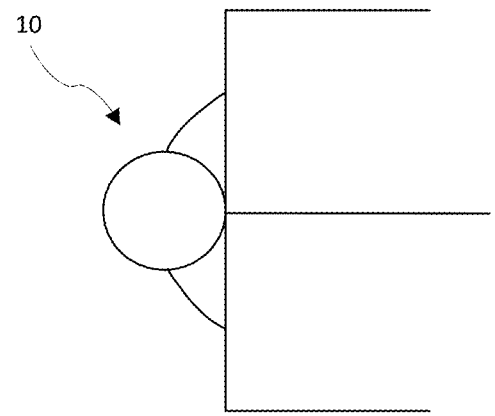
FIG. 4 is an end view of an example implementation of a hinge assembly shown in relation to an illustrative carrying case in closed configuration.

In FIGS. 3-6 the example hinge assembly is further shown in relation to an illustrative carrying case. In FIG. 3 is shown the hinge assembly 10, in end view, joining the members of a case, wherein the case is in an open position. It will be noted that the hinge assembly 10 is mounted to the case housing such that the hinge assembly 10 is disposed substantially between the opposing halves of the case. In FIG. 4 is again shown the hinge assembly 10, in end view, joining the members of a case, wherein the case is in a closed position. It is noted that, when the case is closed, the hinge assembly 10 projects from the case housing. In an implementation, the hinge assembly 10 may be protected from impact by providing suitable corner protectors 45 (see FIG. 5) on the case housing, whereby the corner protectors 45 contact any impinging surface, rather than the hinge assembly 10 itself.

Figure 5:
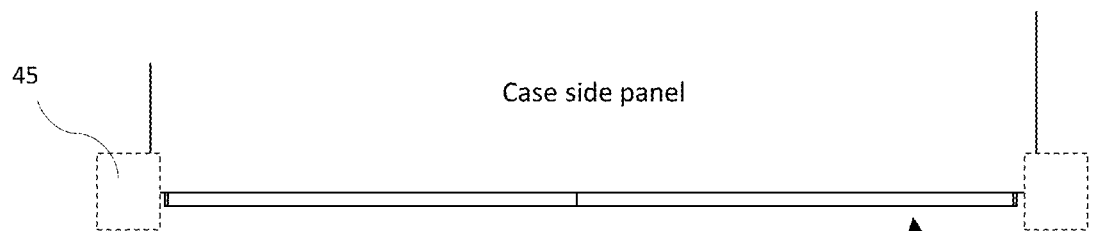
FIG. 5 is a side view of an example implementation of a hinge assembly shown in relation to an illustrative carrying case.
Figure 6:
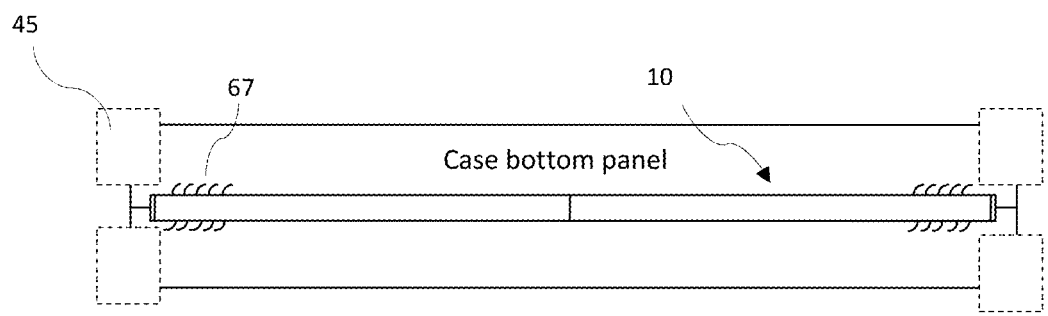
FIG. 6 is a bottom view of an example implementation of a hinge assembly shown in relation to an illustrative carrying case.

In FIG. 5 is shown the hinge assembly 10, in an elevated view, in relation to an illustrative case, wherein the case is in a closed configuration. In FIG. 6 is shown the hinge assembly 10, in side view, in relation to a closed case. In this example implementation, it will be noted that the hinge assembly 10 does not extend to the ends of the representative case. Such an implementation serves to protect the hinge assembly 10 from damaging impact to the hinge assembly ends. In an alternative implementation, the hinge assembly 10 can extend the full length of the case if desired. As discussed supra, corner protectors 45 applied to the case housing might aid in shielding the hinge assembly ends, as well as other hinge assembly surfaces from unwanted impact.

Moving now to the construction, assembly, and operation of the disclosed hinge assembly according to the present inventive concept, in FIG. 7 is shown a hinge segment 17 attached to a case housing, wherein the hinge segment 17 is divided in half longitudinally, producing two opposing semi-cylinders 50 with a semi-circular cross-section, joined by a pivotable living hinge 60. In order to produce the hinge segment 17, the opposing semi-cylinder portions 50 are pivoted together, thereby forming a hollow cylinder. This operation is depicted in FIGS. 8A-8B. In an implementation, the opposing portions 50 of the hinge segment 17 may be equipped with means for securing the two halves together, such as fasteners included during the injection molding process allowing the portions to be quickly and releasably engaged. Such openable members permit any electrical conductors contained therein to be accessed and serviced if necessary. In FIG. 7 is shown an example implementation of such fasteners 53. In the implementation presented, the ends of the hinge segments proximate to the end panels of the case housing are closed off integrally with terminal transverse walls 63 (see FIGS. 7-9). In some implementations, this closure can be the location of fastening means to hold the hinge segment semi-cylinders 50 together, and may also further impede water and debris from entering the hinge interior. In an implementation, the hinge segment 17 may be integrally affixed to the case housing along the long dimension edge of the hinge segment 17. This may be achieved by plastic injection molding of the case housing with the hinge segment 17 as a unitary component. The hinge segment side wall 40 may also incorporate one or more openings to permit passage of electrical cables therethrough. In an implementation, the hinge segment side wall 40 proximate the case housing may include an integrally molded support buttress 67 (see FIG. 8A) to add additional structural reinforcement to the joint between the hinge segment 17 and the case housing (see FIGS. 3-4, 8A, and 8B). This support buttress 67 may be the location of openings therethrough for cable passage between the hinge assembly 17 and the case housing interior 20.

Figure 13:
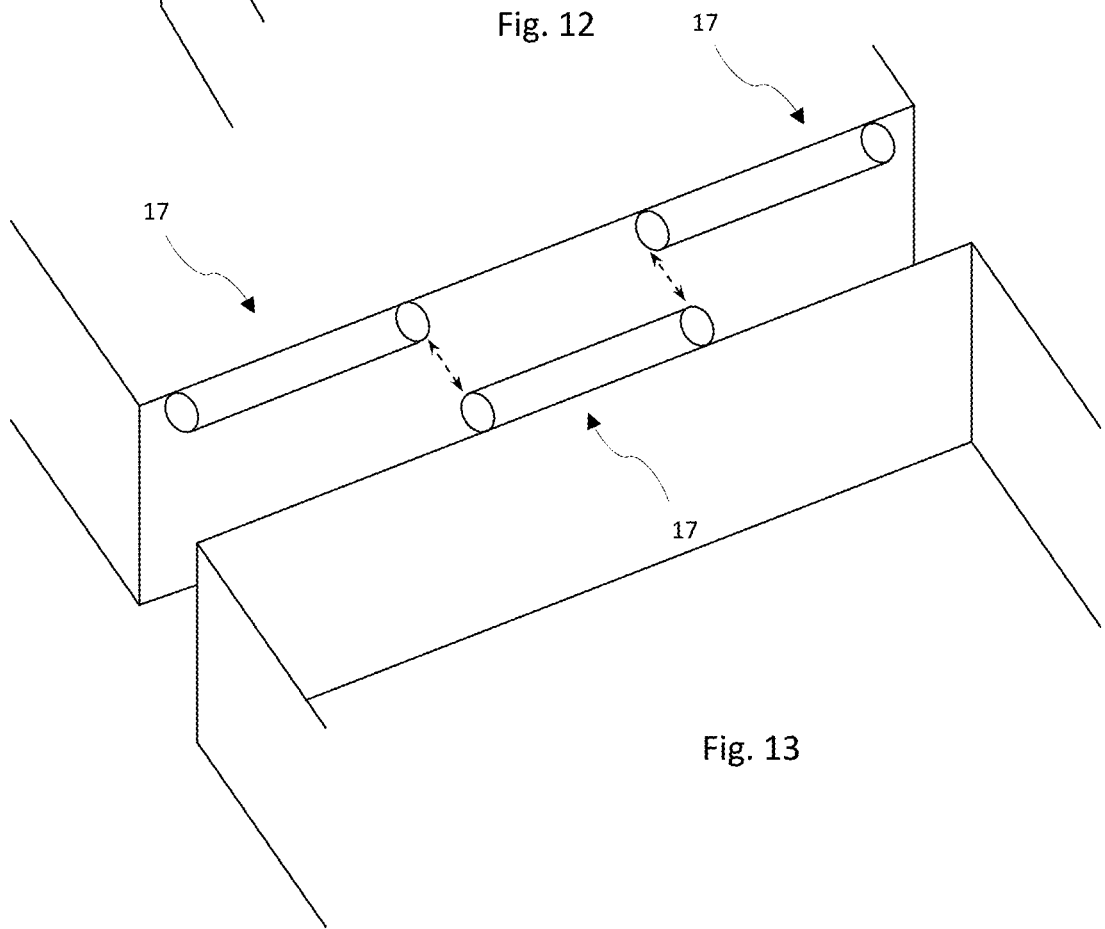
FIG. 13 is an elevated perspective side view of an example implementation showing a three-hinge segment arrangement in relation to an illustrative carrying case.

At least two (2) hinge segments 17 may be combined to form the hinge barrel 65. In some implementations, a multiplicity of hinge segments may be used. In FIG. 13, as an example, three (3) hinge segments 17 are used to comprise the hinge barrel. In the example presented herein, two (2) hinge segments 17, each affixed to opposing case members, are united to form the hinge barrel. In FIG. 9 is shown opposite case members brought together such that their hinge segments 17 are aligned in a mutual axis to form a central hinge channel 70.

After the hinge segments 17 are properly aligned, the hinge barrel 65 produced thereby is secured by a tubular hinge connecting rod 75 (see FIG. 11) which is smaller in outside diameter than the inside diameter of the central hinge channel 70, but of a diameter to fit snugly inside the hinge channel 70. The hinge connecting rod 75 is formed in substantially the same manner as the hinge segments 17. In FIG. 10 is shown an example hinge connecting rod 75 comprised of two (2) opposing semi-cylinder portions 80 coupled by a living hinge 61. As depicted, the semi-cylinder portions 80 define hinge connecting rod side walls 90. When pivoted together along the long dimension, the semi-cylinder portions 80 form a hollow tube with a central passage 85, as shown in FIG. 11. This design advantageously permits the central passage 85 of the hinge connecting rod 75 to receive a plurality of electrical cables 35 prior to the semi-cylinder portions 80 being pivoted together to form the completed hinge connecting rod 785. In FIG. 10 is shown an example cable harness assembly 110 comprising a plurality of electrical conducting wires 35 bound together with cable fastening ties 100 and installed within an open hinge connecting rod 75. In an implementation, the cables 35 may be drawn through flexible grommets 105. The grommets 105 aid in protecting the wires from snarling and abrasion as they pass from the hinge assembly into the case interior. The grommets 105 can engage case side wall openings 95 by simply pressing the grommet into suitably molded flanges on the case housing side wall 55.

After the cable harness assembly is in place, the opposing members of the hinge connecting rod 75 can be pivoted together in order to complete the hinge connecting rod assembly 115 (see FIG. 11). As with the hinge segments, the complementary portions of the hinge connecting rod 75 may include means for openably securing the two halves together, thereby permitting maintenance of any electrical conductors residing therein. In FIG. 10 is shown an example implementation of fasteners 54 for this purpose.

Figure 12:
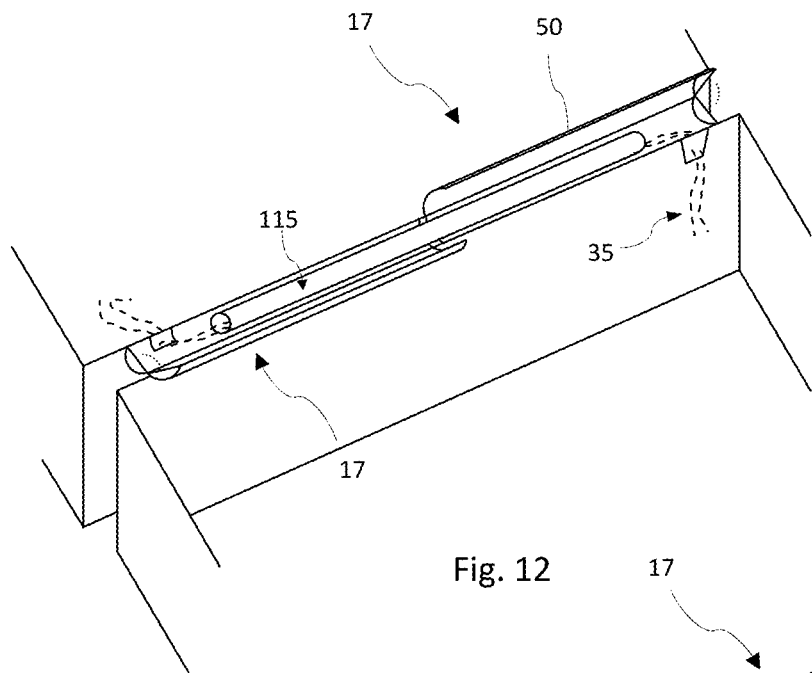
FIG. 12 is an elevated perspective side view of a hinge connecting rod assembly installed within open hinge segments.

The completed hinge connecting rod assembly 115 can then be installed into the open hinge segments 17 as depicted in FIG. 12, in order to stabilize the several hinge segments in a common axis and connect the corresponding members of the case housing. During this operation, the ends of the electrical wires 35 may be passed through corresponding openings in the hinge segments and case housing and into the interior of the case as shown in FIGS. 1-2, 12. Suitable grommets or fittings may be used to protect and hold the wires in place at these openings and to seal the interior of the hinge from moisture and debris. Finally, the hinge connecting rod is secured in place by pivoting the opposing halves 50 of the hinge segments together (see FIGS. 8A and 8B). Appropriate sealing closures or caps may be fitted to the terminal ends of the hinge assembly body to prevent water and debris from entering the hinge assembly interior (see FIG. 2).

It will be recognized that the connecting rod 75 behaves independently of the hinge segments 17; the hinge segments 17 rotate about the hinge rod 75 when the case housing members are opened and closed, while the hinge rod 75 advantageously remains substantially stationary during this action. This feature precludes the electrical wires enclosed within the hinge assembly from unnecessary twisting and bending when the case is opened and closed. In an implementation, the hinge rod may be made of a suitable material, such as polyolefin elastomers or include a Teflon coating, which reduces friction and allows the hinge segments to rotate smoothly and freely around it without requiring additional lubrication. In another implementation, the exterior side wall of the hinge connecting rod, or the interior side wall of the hinge segment may include one or more load-bearing ridges or surfaces for the hinge segments to rotate upon, thereby facilitating motion of the hinge segments. In other implementations, the hinge connecting rod may assume a different length, relative to the hinge assembly, than that exhibited in the drawing figures herein.

Figure 14:
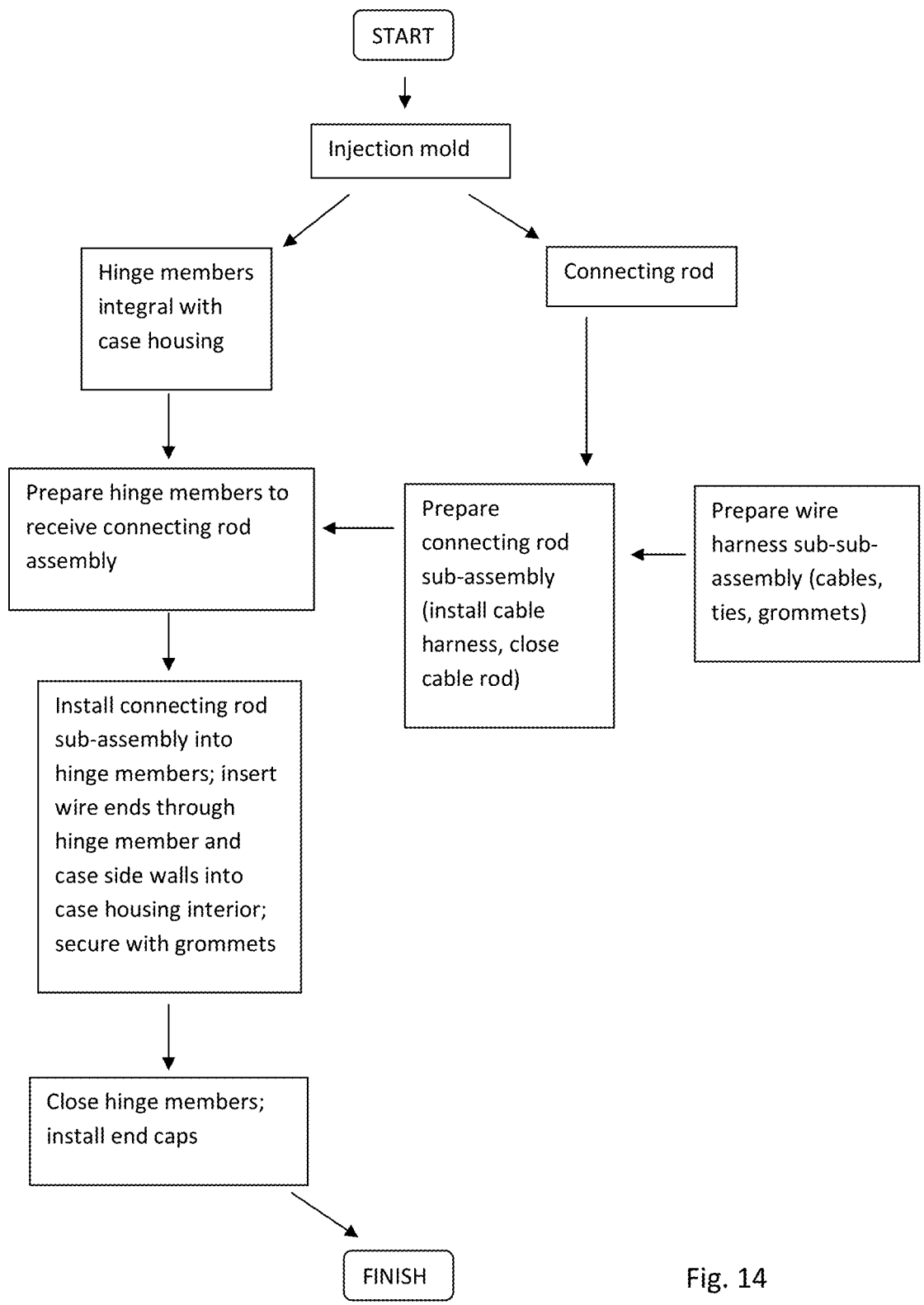
FIG. 14 is a flow diagram representation of a hinge assembly process implementation.

In FIG. 14 is shown a flow diagram representation of an example implementation of a hinge assembly process, in accordance with the inventive aspect described herein. Modifications to the process as presented may be contemplated without departing from the scope of the present disclosure.

Figure 15:
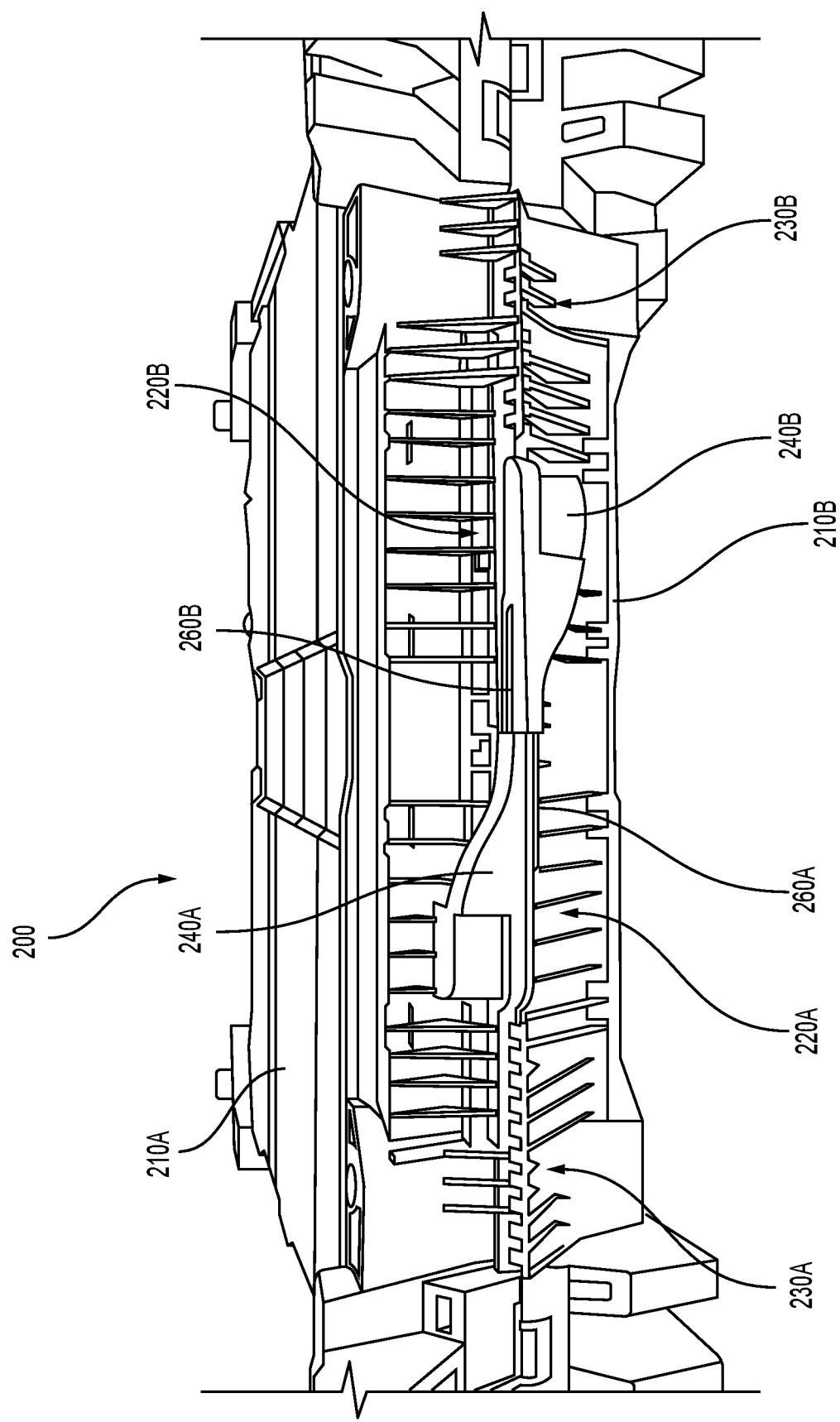
FIG. 15 is a rear view of a hinge assembly in the closed configuration in relation to an illustrative carrying case.

FIGS. 15-18 illustrate another example implementation of the present invention. In particular, FIG. 15 illustrates a carrying case 200 that includes two opposing halves: a first half 210A, and a second half 210B, which are configured to rotate relative to each other to and from open and closed positions. In the depicted implementations, the carrying case 200 is configured house one or more electronic components. The carrying case of the depicted implementation also includes first and second hinge assemblies that comprise respective first and second cable hinge assemblies 220A, 220B and respective first and second pin hinge assemblies 2230A, 230B. In the depicted implementation, the first and second cable hinge assemblies 220A, 220B are located in between the first and second pin hinge assemblies 230A, 230B, with the first and second cable hinge assemblies 220A, 220B being located proximate each other. In particular, in the depicted implementation, ends the first and second cable hinge assemblies 220A, 220B substantially abut one another.

Figure 16:
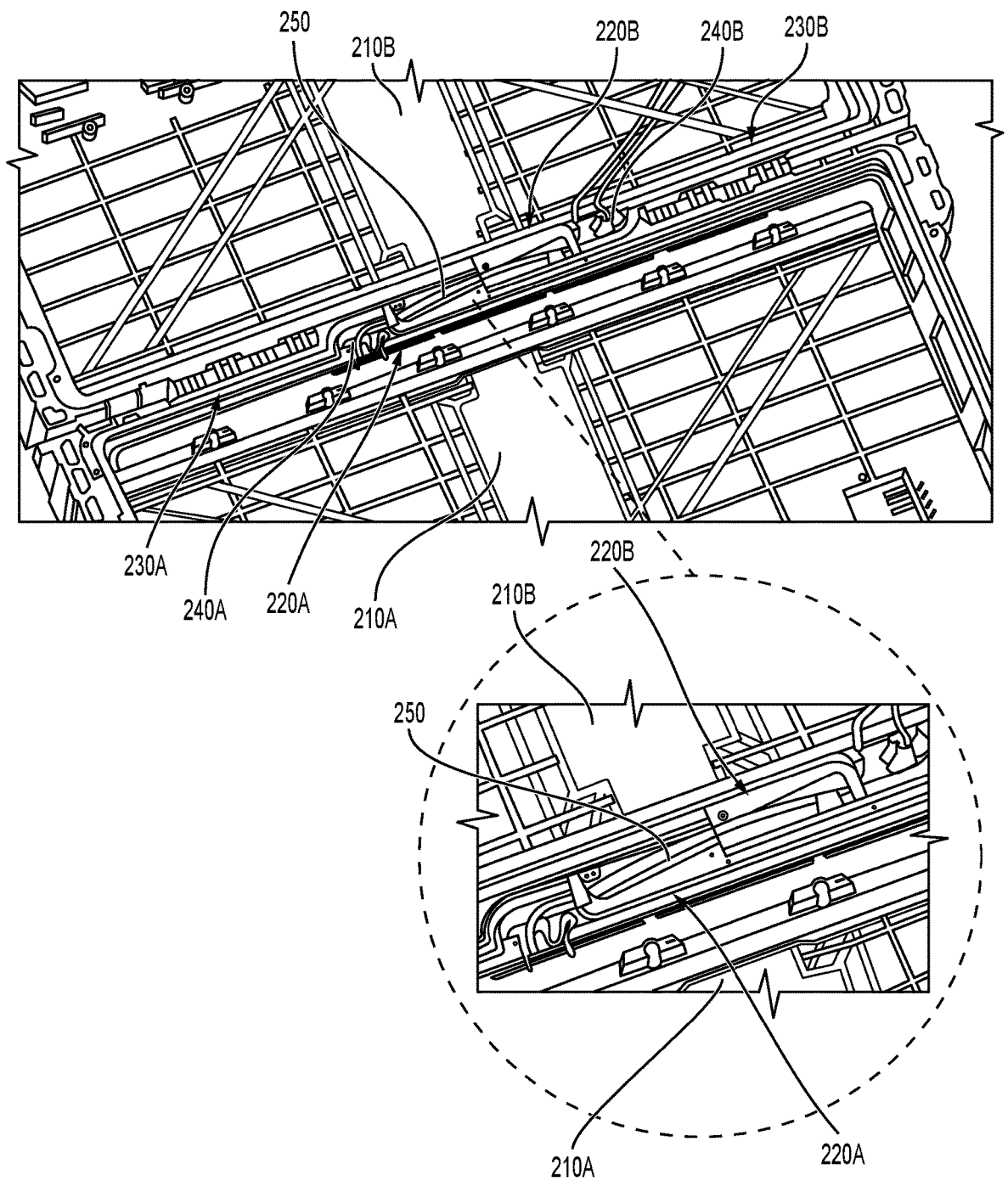
FIG. 16 is an elevated perspective side view of an example implementation showing a hinge assembly in relation to an illustrative carrying case.
Figure 17:
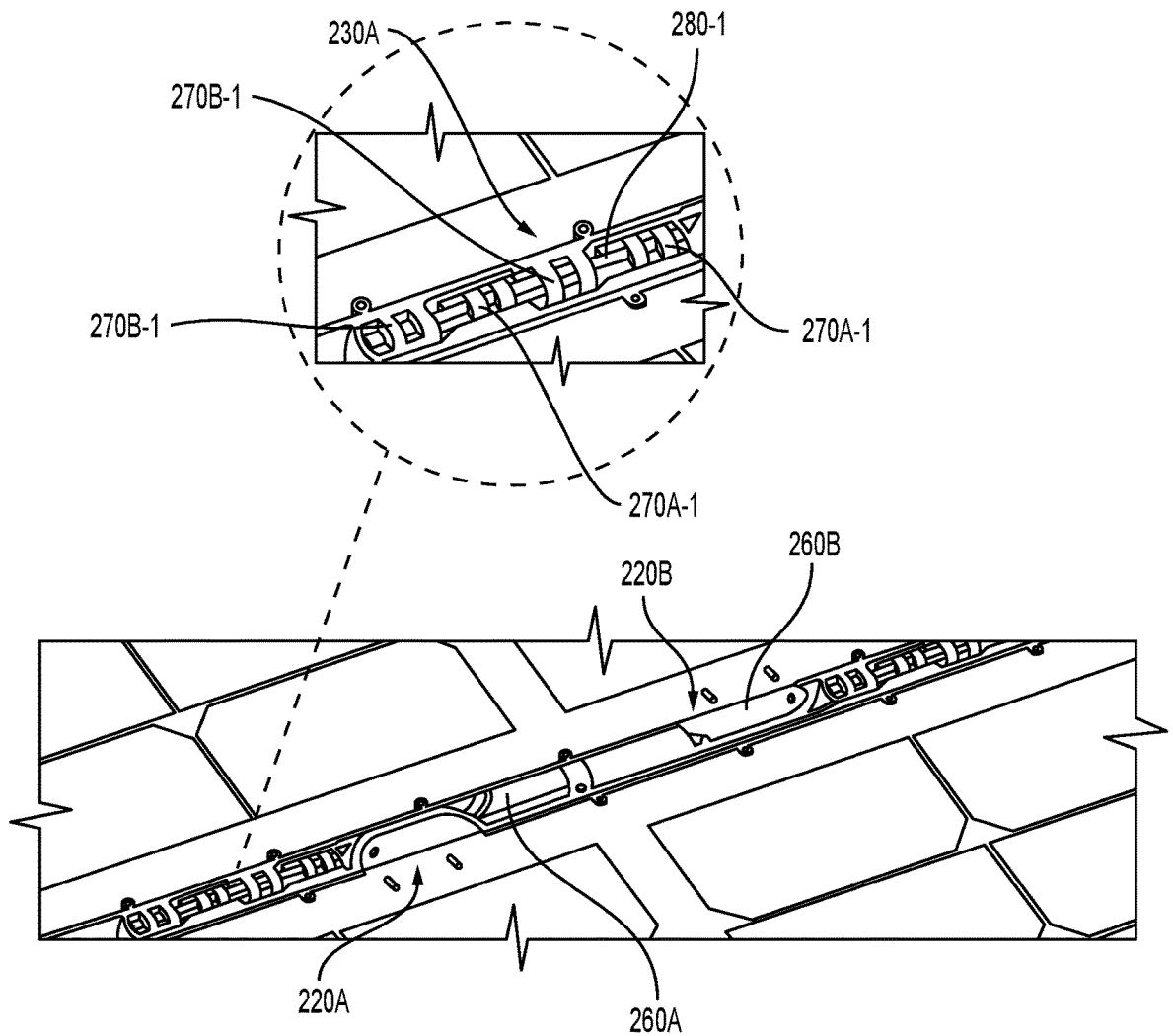
FIG. 17 is an elevated perspective side view of an example implementation showing a hinge assembly in relation to an illustrative carrying case.
Figure 18:
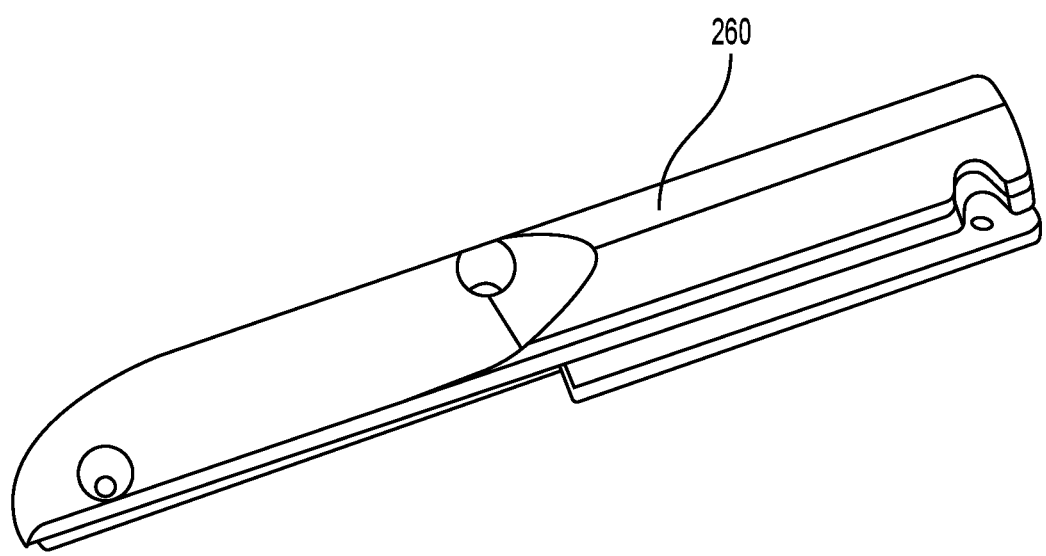
FIG. 18 is an elevated perspective side view of a cover portion.

With further reference to FIGS. 16 and 17, which illustrate the carrying case in an open position, each of the first and second cable hinge assemblies 220A, 220B comprises a respective pass-through portion 240A, 240B and a respective cover portion 260A, 260B. The cover portions 260A, 260B are shown in FIG. 15 and illustrated as transparent in FIG. 17, but have been removed in FIG. 16 for ease of illustration. In various implementation, the cable hinge assemblies are configured to convey one or more electrical conductors (e.g., one or more electrical cables) from one half of the carrying case to the other half of the carrying case. For example, each of the cable hinge assemblies may include an opening configured to permit passage of one or more electrical conductors therethrough. In the depicted implementation, one or more electrical conductors 250 extend from the first half 210A of a carrying case to the second half 210B of the carrying case (or vice versa) through respective openings in the pass-through portions 240A, 240B. In the depicted implementation, the covers 260A, 260B are configured to be secured over the respective pass-through portions 240A, 240B using one or more fasteners. In other implementations, the covers may be secured in other ways, including, for example, via snap-fit or press-fit attachments.

In the depicted implementations, each of the pin hinge assemblies includes a pin, and a bracket portion, which includes components from both the first and second halves of the carrying case. With reference to the detail portion of FIG. 17, which is representative of the depicted pin hinge assemblies, the first pin hinge assembly 230A includes a first bracket portion 270A-1 that includes spaced knuckle features extending from the first half 210A of the housing, and a second bracket portion 270B-1 that includes spaced knuckle features extending from the second half 210B of the housing. The first pin assembly 230A also includes a pin 280-1, which is configured to extend through the first and second bracket portions 270A-1, 270B-1. Although various materials may be used for the different components of a pin hinge assembly, in the depicted implementation, the first and second bracket portions 270A-1, 270B-1 are integrally joined to the respective housing halves 210A, 210B (e.g., as part of the same injection molded plastic part), and the pin 280-1 comprises a different material (e.g., a metal material).

Although the above description describes the first and second halves 210A, 210B of the housing separately, it should be noted that in depicted implementation, the second half 210B of the housing represents a duplicate version of the first half 210A of the housing (or vice versa). In such a manner, a carrying case of the depicted implementation may be assembled using two of the same housing halves that are rotated with respect to one another and joined together via the pin hinge assemblies, wherein the respective bracket portions of the pin hinge assemblies nest with each other and are secured together using two of the same pins. One or more electrical conductors may extend through the pass-through portions, and each of the pass-through portions may be covered with two cover portions, which represents the same part (shown in FIG. 18), each of which is rotated to properly align and cover a respective pass-through portion.

From the foregoing description it will be appreciated that the various implementations disclosed herein provide a hinge assembly that is simple in design with a minimum of separate parts, inexpensively manufactured, and readily assembled. Further, the inventive aspects include a hinge assembly specially adapted to enclose and convey electrical conductors, such as cables, from one half of a carrying case to the other, while protecting the conductors from damage.

While various implementations have been described above, it should be understood that they have been presented by way of example only, and not limitation. It will be apparent to persons skilled in the relevant art that various changes in form and detail can be made therein without departing from the spirit and scope of the implementations. Thus, the breadth and scope of the implementations should not be limited by any of the above-described example implementations, but should be defined only in accordance with the following claims and their equivalents.

What is claimed is:

1. A hinge assembly for rotatably coupling opposing halves of a housing of a carrying case containing electronic components, the hinge assembly comprising:
   at least two cable hinge segments, each comprising a first hollow section and a second hollow section, the at least two cable hinge segments configured to rotate about a common axis and creating a continuous central channel therethrough when aligned in linear fashion; and
   a hollow, tubular connecting rod,
   wherein the central channel of the at least two hinge segments is configured to receive the hollow, tubular connecting rod therein.

2. The hinge assembly of claim 1, wherein each of the at least two cable hinge segments further includes an opening in a side wall thereof configured to permit passage of one or more electrical conductors into a channel thereof.

3. The hinge assembly of claim 2, wherein the openings of the at least two cable hinge segments are positioned to permit passage of the one or more electrical conductors are configured to exit the hinge assembly through side walls of the at least two cable hinge segments proximate terminal ends thereof.

4. The hinge assembly of claim 1, wherein the at least two cable hinge segments are configured to rotate relative to the connecting rod.

5. The hinge assembly of claim 1, wherein the connecting rod is formed from a first hollow semi-cylinder joined to a second hollow semi-cylinder by a living hinge, the opposing semi-cylinders defining a continuous central passage when brought together, and wherein the central passage is configured to receive one or more electrical conductors therethrough.

6. The hinge assembly of claim 5, wherein the connecting rod includes openings in a side wall thereof configured to permit the passage of the electrical conductors into the central passage thereof.

7. The hinge assembly of claim 1, wherein one or more of the hollow sections of the at least two cable hinge segments includes fasteners configured to secure the hollow sections together.

8. The hinge assembly of claim 1, wherein respective ends of the at least two cable hinge segments are closed off.

9. A hinge assembly of a carrying case containing electronic components, the hinge assembly comprising:
at least two pin hinge assemblies; and
at least two cable hinge assemblies,
wherein each of the at least two cable hinge assemblies comprises a pass-through portion and a cover portion, wherein one of the at least two pass-through portions is configured to convey one or more electrical conductors to another of the at least two pass-through portions, and wherein one of the at least two cover portions is configured to cover one of the at least two pass-through portions, and another of the at least two cover portions is configured to cover another of the at least two pass-through portions.

10. The hinge assembly of claim 9, wherein the at least two pin hinge assemblies comprise a first pin hinge assembly and a second pin hinge assembly, and wherein the at least two cable hinge assemblies comprise a first cable hinge assembly and a second cable hinge assembly, and wherein the first and second cable hinge assemblies are located between the first and second pin hinge assemblies.

11. The hinge assembly of claim 10, wherein the first cable hinge assembly is located proximate the second cable hinge assembly.

12. The hinge assembly of claim 9, wherein each of the at least two cable hinge assemblies includes an opening configured to permit passage of one or more electrical conductors therethrough.

13. A carrying case containing electronic components, the carrying case comprising:
opposing halves of a housing; and
a hinge assembly comprising:
at least two pin hinge assemblies; and
at least two cable hinge assemblies,
wherein each of the at least two cable hinge assemblies comprises a pass-through portion and a cover portion, wherein one of the at least two pass-through portions is configured to convey one or more electrical conductors to another of the at least two pass-through portions, and wherein one of the at least two cover portions is configured to cover one of the at least two pass-through portions, and another of the at least two cover portions is configured to cover another of the at least two pass-through portions.

14. The carrying case of claim 13, wherein the at least two pin hinge assemblies comprise a first pin hinge assembly and a second pin hinge assembly, and wherein the at least two cable hinge assemblies comprise a first cable hinge assembly and a second cable hinge assembly, and wherein the first and second cable hinge assemblies are located between the first and second pin hinge assemblies.

15. The carrying case of claim 14, wherein the first cable hinge assembly is located proximate the second cable hinge assembly.

16. The carrying case of claim 13, wherein each of the at least two cable hinge assemblies includes an opening configured to permit passage of the one or more electrical conductors therethrough.

17. The carrying case of claim 13, wherein one of the at least two cable hinge assemblies configured to rotate relative to another of the at least two cable hinge assemblies.

18. The carrying case of claim 13, wherein the pass-through portion of one of the at least two cable hinge assemblies is integrally joined to one half of the housing, and the pass-through portion of another of the at least two cable hinge assemblies is integrally joined to the other half of the housing.

19. The carrying case of claim 13, wherein each of the at least two cable hinge assemblies includes one or more fasteners configured to secure a respective cover portion to the pass-through portion.

20. The carrying case of claim 13, wherein each of the at least two pin hinge assemblies includes a bracket portion and a pin, and wherein part of the bracket portion is integrally joined to one half of the housing, and another part of the bracket portion is integrally joined to another half of the housing.

\* \* \* \* \*